(12) United States Patent
Sakakura et al.

(10) Patent No.: US 8,139,001 B2
(45) Date of Patent: Mar. 20, 2012

(54) DISPLAY DEVICE

(75) Inventors: Masayuki Sakakura, Kanagawa (JP);
Ritsuko Nagao, Kanagawa (JP);
Mitsuaki Osame, Kanagawa (JP); Aya Anzai, Kanagawa (JP); Yu Yamazaki, Tokyo (JP); Yoshifumi Tanada, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 13/211,815

(22) Filed: Aug. 17, 2011

(65) Prior Publication Data

US 2011/0298362 A1 Dec. 8, 2011

Related U.S. Application Data

(63) Continuation of application No. 11/774,401, filed on Jul. 6, 2007, now Pat. No. 8,018,403, which is a continuation of application No. 10/827,444, filed on Apr. 20, 2004, now Pat. No. 7,250,720.

(30) Foreign Application Priority Data

Apr. 25, 2003 (JP) .................................. 2003-122988

(51) Int. Cl.
*G09G 3/30* (2006.01)
(52) U.S. Cl. ........................................................ 345/76
(58) Field of Classification Search .................. 345/30, 345/44–46, 55, 76–82, 92, 84; 313/505–508, 313/495, 169.3, 169.4
See application file for complete search history.

(56) References Cited

U.S. PATENT DOCUMENTS

| 3,219,865 | A | 11/1965 | Vincent |
| 4,914,503 | A | 4/1990 | Shirato et al. |
| 5,075,674 | A | 12/1991 | Katayama et al. |
| 5,182,620 | A | 1/1993 | Shimada et al. |
| 5,483,082 | A | 1/1996 | Takizawa et al. |
| 5,491,352 | A | 2/1996 | Tsuji |
| 5,550,070 | A | 8/1996 | Funai et al. |
| 5,636,329 | A | 6/1997 | Sukegawa et al. |
| 5,644,147 | A | 7/1997 | Yamazaki et al. |
| 5,739,549 | A | 4/1998 | Takemura et al. |
| 5,744,820 | A | 4/1998 | Matsushima et al. |
| 5,780,872 | A | 7/1998 | Misawa et al. |

(Continued)

FOREIGN PATENT DOCUMENTS

EP 0318224 A2 5/1989

(Continued)

OTHER PUBLICATIONS

Inukai et al., "4.0-in. TFT-OLED Displays and a Novel Digital Driving Method", Digest of Technical Papers, SID Digest '00, vol. XXXI, pp. 924-927, May 16-18, 2000.

(Continued)

*Primary Examiner* — Richard Hjerpe
*Assistant Examiner* — Jeffrey A Parker
(74) *Attorney, Agent, or Firm* — Fish & Richardson P.C.

(57) ABSTRACT

A display device with high-definition, in which display unevenness due to a voltage drop in a wiring or display unevenness due to a variation in characteristics of TFTs are suppressed. The display device of the invention comprises a first wiring for transmitting a video signal and a second wiring for supplying a current to a light emitting element. The first wiring and the second wiring extend parallel to each other, and are formed so as to overlap with each other at least partly with an insulating layer interposed therebetween.

12 Claims, 11 Drawing Sheets

U.S. PATENT DOCUMENTS

| | | | |
|---|---|---|---|
| 5,804,501 | A | 9/1998 | Kim |
| 5,818,070 | A | 10/1998 | Yamazaki et al. |
| 5,899,547 | A | 5/1999 | Yamazaki et al. |
| 5,929,948 | A | 7/1999 | Ohori et al. |
| 5,962,959 | A | 10/1999 | Iwasaki et al. |
| 5,985,746 | A | 11/1999 | Kapoor |
| 6,008,065 | A | 12/1999 | Lee et al. |
| 6,072,556 | A | 6/2000 | Hirakata et al. |
| 6,124,604 | A | 9/2000 | Koyama et al. |
| 6,137,218 | A | 10/2000 | Kaneko et al. |
| 6,166,396 | A | 12/2000 | Yamazaki |
| 6,168,851 | B1 | 1/2001 | Kubota |
| 6,198,133 | B1 | 3/2001 | Yamazaki et al. |
| 6,198,517 | B1 | 3/2001 | Ohori et al. |
| 6,239,854 | B1 | 5/2001 | Hirakata et al. |
| 6,246,179 | B1 | 6/2001 | Yamada |
| 6,353,280 | B1 | 3/2002 | Shibata et al. |
| 6,384,818 | B1 | 5/2002 | Yamazaki et al. |
| 6,522,079 | B1 | 2/2003 | Yamada |
| 6,630,687 | B1 | 10/2003 | Koyama et al. |
| 6,730,966 | B2 | 5/2004 | Koyama |
| 6,734,839 | B2 | 5/2004 | Yudasaka |
| 6,759,678 | B2 | 7/2004 | Yamazaki et al. |
| 6,839,120 | B2 | 1/2005 | Choo et al. |
| 6,844,683 | B2 | 1/2005 | Yamauchi et al. |
| 6,862,008 | B2 | 3/2005 | Yamazaki et al. |
| 6,882,105 | B2 | 4/2005 | Murakami et al. |
| 6,906,344 | B2 | 6/2005 | Yamazaki et al. |
| 7,079,093 | B2 | 7/2006 | Sun |
| 7,112,817 | B2 | 9/2006 | Yamazaki et al. |
| 7,154,119 | B2 | 12/2006 | Yamazaki et al. |
| 7,250,720 | B2 | 7/2007 | Sakakura et al. |
| 7,435,992 | B2 | 10/2008 | Choi et al. |
| 7,535,022 | B2 | 5/2009 | Yamazaki et al. |
| 7,573,469 | B2 | 8/2009 | Yamazaki et al. |
| 2001/0002703 | A1 | 6/2001 | Koyama |
| 2001/0015618 | A1 | 8/2001 | Yamazaki et al. |
| 2001/0022677 | A1 | 9/2001 | Hirakata et al. |
| 2001/0052954 | A1 | 12/2001 | Ohori et al. |
| 2002/0113760 | A1 | 8/2002 | Kimura |
| 2002/0196212 | A1 | 12/2002 | Nishitoba et al. |
| 2002/0196389 | A1 | 12/2002 | Koyama |
| 2003/0090447 | A1 | 5/2003 | Kimura |
| 2003/0107536 | A1 | 6/2003 | Ishizuka et al. |
| 2003/0160745 | A1 | 8/2003 | Osame et al. |
| 2003/0164685 | A1 | 9/2003 | Inukai |
| 2003/0222589 | A1 | 12/2003 | Osame et al. |
| 2005/0012686 | A1 | 1/2005 | Osame et al. |
| 2007/0246777 | A1 | 10/2007 | Yamazaki et al. |
| 2010/0073272 | A1 | 3/2010 | Yamazaki et al. |

FOREIGN PATENT DOCUMENTS

| | | |
|---|---|---|
| EP | 1098290 A2 | 5/2001 |
| EP | 1107220 A2 | 6/2001 |
| EP | 1132960 A3 | 9/2001 |
| JP | 01-134343 A | 5/1989 |
| JP | 01-134344 A | 5/1989 |
| JP | 04-313729 A | 11/1992 |
| JP | 05-053127 A | 3/1993 |
| JP | 05-241200 A | 9/1993 |
| JP | 06-138488 A | 5/1994 |
| JP | 06-160904 A | 6/1994 |
| JP | 06-250221 A | 9/1994 |
| JP | 07-175038 A | 7/1995 |
| JP | 2000-356963 A | 12/2000 |
| JP | 2001-109405 A | 4/2001 |
| JP | 2001-326362 A | 11/2001 |
| JP | 2002-149112 A | 5/2002 |
| JP | 2002-278497 A | 9/2002 |
| JP | 2002-323873 A | 11/2002 |
| JP | 2002-358031 A | 12/2002 |
| JP | 2003-005710 A | 1/2003 |
| JP | 2003-051599 A | 2/2003 |
| JP | 2003-058075 A | 2/2003 |
| JP | 2003-058107 A | 2/2003 |
| JP | 2003-108036 A | 4/2003 |
| JP | 2004-341513 A | 12/2004 |
| JP | 4689188 B2 | 5/2011 |
| WO | WO 03/027997 A1 | 4/2003 |

OTHER PUBLICATIONS

Mizukami et al.,"6-Bit Digital VGA OLED", Digest of Technical Papers, SID Digest '00, vol. XXXI, pp. 912-915; May 16-18, 2000.

DISPLAY DEVICE

CROSS-REFERENCE TO RELATED APPLICATIONS

This application is a continuation of U.S. application Ser. No. 11/774,401, filed Jul. 6, 2007, now allowed, which is a continuation of U.S. application Ser. No. 10/827,444, filed Apr. 20, 2004, now U.S. Pat. No. 7,250,720, which claims the benefit of a foreign priority application filed in Japan as Ser. No. 2003-122988 on Apr. 25, 2003, all of which are incorporated by reference.

BACKGROUND OF THE INVENTION

1. Field of the Invention

The present invention relates to an active matrix display device, and more particularly to a wiring structure of an active matrix display device comprising a light emitting element.

2. Description of the Related Art

In recent years, development of large-scale electroluminescence (hereinafter abbreviated to EL) display device has been advanced with the intention of coming to the television market.

When wiring length increases according to the increase in size of a display device, such problem as a voltage drop arises. There is a problem in that a voltage applied to each EL element varies with place by generation of the voltage drop so that display unevenness is caused.

In the case where film thickness of the wiring is increased in order to solve the above-mentioned problem, a lot of loads are applied to the steps of forming film, etching and the like. In addition, in the case where line width of the wiring is increased, the area ratio that the wiring occupies on the substrate is increased. Thus it makes difficult to fabricate a display device with high-definition.

With the increase in size of a display device, particularly in an active matrix display device, a variation in characteristics of thin film transistors (hereinafter referred to as TFTs) for transmitting an electric signal to an EL element on a substrate becomes large, leading to display unevenness.

Aiming to reduce the display unevenness due to the variation in characteristics of TFTs, a circuit for driving the EL element has been configured taking it into consideration (e.g., Patent Document 1). However, by providing a circuit for compensating for the variation in characteristics of TFTs, the ratio that the circuit occupies on the substrate is increased and the aperture ratio of a pixel portion is reduced.

[Patent Document 1]

As described above, it is difficult to achieve the high-definition of a display device and the suppression of display unevenness due to a voltage drop in wirings or due to a variation in characteristics of TFTs at the same time.

SUMMARY OF THE INVENTION

In view of the foregoing problem, an object of the present invention is to provide a display device with high-definition, in which display unevenness due to a voltage drop in wirings or the one due to a variation in characteristics of TFTs is suppressed.

A display device of the invention comprises a first wiring for transmitting a video signal and a second wiring for supplying a current to a light emitting element. The first and the second wirings extend parallel to each other, and are formed so as to be overlapped at least partly with an insulating layer interposed therebetween. Note that, the light emitting element has a structure in which a light emitting layer is sandwiched between a pair of electrodes.

The first and the second wirings may be overlapped so that the first wiring is the upper or the first wiring is the lower.

The first and the second wirings are not necessarily overlapped entirely, but they may be overlapped partly.

Electrodes of the light emitting element may be formed on the same layer as the upper wiring, namely either the first wiring or the second wiring. With this structure, a pixel electrode (an electrode of a pair of electrodes of the light emitting element, which is connected to a circuit for transmitting a signal to the light emitting element) can be formed without additionally forming an insulating layer. Consequently, the steps of forming film, opening a contact hole and the like are simplified.

With the above-mentioned structure, in the case of suppressing a voltage drop by increasing the width of the second wiring, the width can be increased using efficiently either the upper part or the lower part of the surface occupied by the first wiring. Thus, decrease in the aperture ratio due to increase in the width of the second wiring is suppressed as less as possible. In addition, short circuit generated between the first and the second wirings can be reduced because the first and the second wirings are fanned on different layers.

A display device of the invention comprises a first wiring for transmitting a video signal, a second wiring for supplying a current to a light emitting element, and a third wiring extending parallel to the first and the second wirings. The first and the second wirings are formed on the same layer, the third wiring is formed either over or under the first and the second wirings so as to overlap at least partly with either the first wiring or the second wiring with an insulating layer interposed therebetween, and the second wiring and the third wiring are connected to each other.

The first and the second wirings may be overlapped over the third wiring, or under the third wiring.

Electrodes of the light emitting element may be formed on the same layer as the upper wiring, namely either the first wiring or the third wiring. With this structure, a pixel electrode can be formed without additionally forming an insulating layer. Consequently, the steps of forming film, opening a contact hole and the like are simplified.

As mentioned above, by providing the third wiring which overlaps at least partly with the first wiring or the second wiring, a voltage drop of the second wiring is suppressed using efficiently either the upper part or the lower part of the surface occupied by the first wiring or the second wiring.

A display device of the invention comprises a first wiring for transmitting a video signal, a second wiring for supplying a current to a light emitting element, and a third wiring extending parallel to the first wiring and the second wiring. The first wiring and the second wiring are formed so as to overlap at least partly with an insulating layer interposed therebetween, the third wiring is formed so as to overlap at least partly with either the first wiring or the second wiring with an insulating layer interposed therebetween, and the second wiring and the third wiring are connected to each other.

The first and the second wirings may be overlapped so that the first wiring is the upper or the first wiring is the lower.

The first and the second wirings are not necessarily overlapped entirely, and they may be overlapped partly.

The third wiring may be overlapped over the first wiring, or under the first wiring. The third wiring may also be overlapped over the second wiring, or under the second wiring.

Electrodes of the light emitting element may be formed on the same layer as the most upper wiring among the first wiring, the second wiring and the third wiring. With this structure, a pixel electrode can be formed without additionally forming an insulating layer. Consequently, the steps of forming film, opening a contact hole and the like are simplified.

With the above-mentioned structure, a voltage drop generated in the second wiring can be more reduced.

As described above, according to the invention, a display device with high image quality and high-definition can be fabricated while suppressing display unevenness due to a voltage drop in wirings for supplying a current to a light emitting element.

As another configuration, a display device of the invention comprises a light emitting element, a first transistor for determining a current value for flowing to the light emitting element, a second transistor for determining whether the light emitting element emits light or not according to a video signal, a third transistor for controlling an input of the video signal, a fourth transistor for making the light emitting element in a non-light emitting state regardless of the video signal, a first wiring connected to the third transistor and transmitting the video signal, a second wiring connected to the second transistor and supplying a current to the light emitting element through the first and the second transistors, and a third wiring connected to the gate electrode of the first transistor. The first wiring, the second wiring and the third wiring extend parallel to each other, and the first wiring and the third wiring are formed on the same layer and overlapped with the second wiring at least partly with an insulating layer interposed therebetween.

With the above-mentioned configuration, display unevenness due to a variation in characteristics of TFTs and the one due to a voltage drop in the wiring for supplying a current to a light emitting element can be suppressed.

According to the invention, a display device with high image quality and high-definition can be obtained in which display unevenness due to a voltage drop in a wiring is suppressed. In addition, a display device with high image quality and high-definition can be obtained, in which display unevenness due to a voltage drop in a wiring and display unevenness due to a variation in characteristics of TFTs are both suppressed.

DETAILED DESCRIPTION OF THE INVENTION

Embodiment modes of the present invention will be explained with reference to the accompanying drawings hereinafter. However, it is to be understood that various changes and modifications will be apparent to those skilled in the art. Therefore, unless otherwise such changes and modifications depart from the scope of the present invention, they should be construed as being included therein.

[Embodiment Mode 1]

An embodiment mode of the invention will be explained with reference to FIG. 1.

Figure 1:
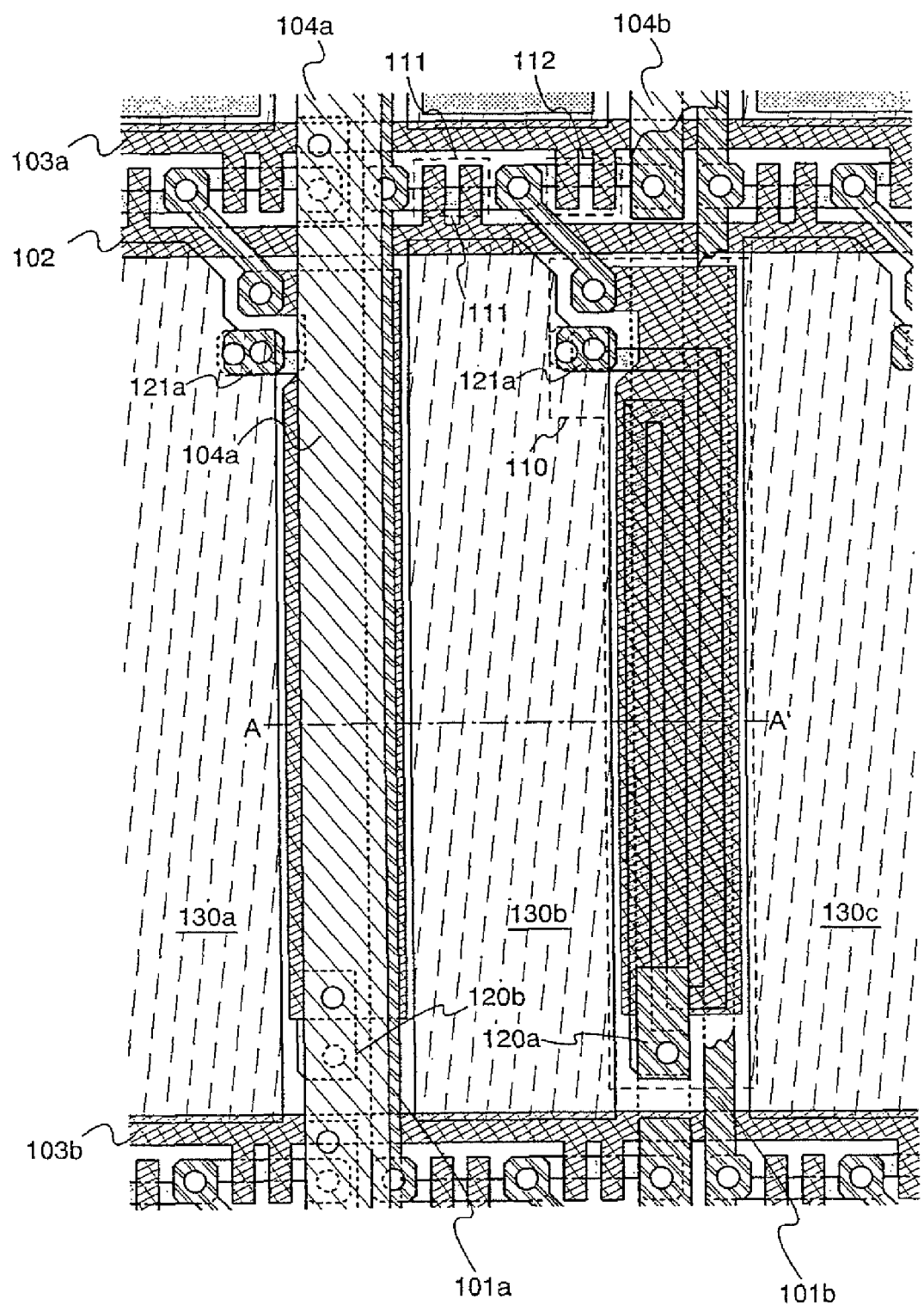
FIG. 1 is a diagram describing one mode of the invention.
Figure 9:
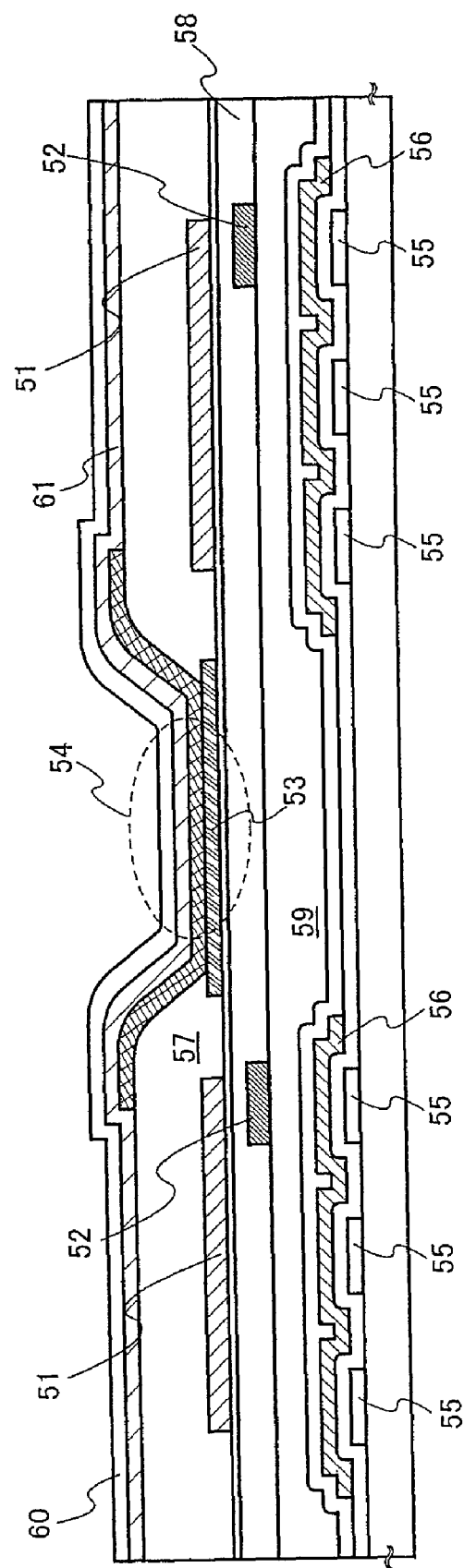
FIG. 9 is a view describing one mode of the invention.

FIG. 1 is a top plan view of a pixel portion of a display device to which the invention is applied. FIG. 9 is a cross-sectional view cutting along a line A-A' of FIG. 1.

In FIG. 1, provided are a source signal line 101 (101*a*, 101*b*) as a wiring for transmitting a video signal and a current supply line 104 (104*a*, 104*b*) as a wiring for supplying a current to a light emitting element. The source signal line 101 and the current supply line 104 are formed on different layers with an insulating layer interposed therebetween to overlap with each other. In addition, they extend parallel to each other. Note that, although the entire source signal line 101 and the current supply line 104 are overlapped with each other in this embodiment mode, a part of the source signal line 101 and a part of the current supply line 104 may be overlapped. In any case, the width of the current supply line 104 can be increased by using the upper part of the source signal line 101. In addition, in this embodiment mode, the current supply line 104 is provided over the source signal line 101, however, the invention is not limited to this structure, and the current supply line 104 may be provided under the source signal line 101.

In addition to the source signal line 101 and the current supply line 104, a driving TFT 110 for determining whether the light emitting element emits light or not according to a video signal, a switching TFT 111 for controlling the input of the video signal, and an erasing TFT 112 for making the light emitting element in a non-light emitting state regardless of the video signal are provided in the pixel portion.

In this embodiment mode, the current supply line 104 is connected to the driving TFT 110 through a conductive layer 120 (120*a*, 120*b*) which is formed on the same layer as the source signal line 101. A part of a first gate signal line 102 functions as the gate electrode of the switching TFT 111. A part of a second gate signal line 103 (103*a*, 103*b*) functions as the gate electrode of the erasing TFT 112. In addition, the driving TFT 110 is connected to a first electrode 130 (130*a*, 130*b*, 130*c*) of the light emitting element through a conductive layer 121 (121*a*, 121*b*) which is formed on the same layer as the source signal line 101. Being not shown in FIG. 1, a bank having an opening portion is formed so as to expose the first electrode 130 of the light emitting element, an electroluminescent layer, and a second electrode of the light emitting element. An overlapping area of the first electrode 130 of the light emitting element, the electroluminescent layer and the second electrode of the light emitting element functions as the light emitting element.

In FIG. 9, reference numeral 51 denotes a current supply line, 52 denotes a source signal line, 53 denotes a first electrode of a light emitting element, 54 denotes the light emitting element, 55 denotes a semiconductor layer, 56 denotes a gate electrode, 57 denotes a bank, 58 and 59 denote insulating layers, 60 denotes a protective film, and 61 denotes a second electrode of the light emitting element.

Figure 2:
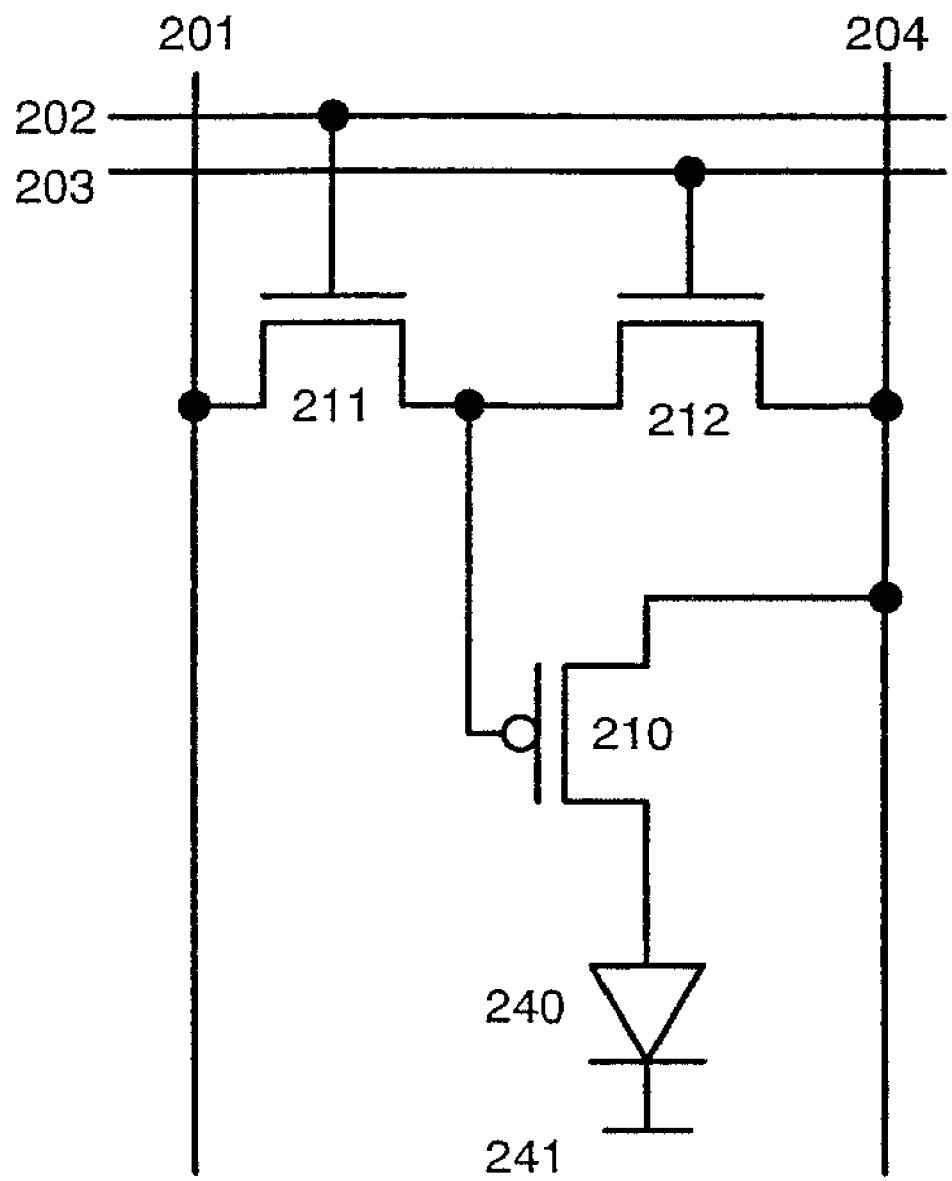
FIG. 2 is a diagram showing a circuit in a pixel portion.

FIG. 2 shows a circuit configuration of the pixel portion shown in this embodiment mode. In this embodiment mode, a driving TFT 210, a switching TFT 211, and an erasing TFT 212 are provided, however, a circuit configuration comprising only the driving TFT 210 and the switching TFT 211, or a circuit configuration comprising other TFT or wiring may be applied. That is, the circuit configuration of the invention is not limited to the one shown in this embodiment mode.

Furthermore, a thin film transistor (TFT) is used in this embodiment mode, however, a transistor fabricated by using a silicon wafer of bulk or an SOI (Silicon On Insulator) may also be used. As the structure of the transistor, both a single gate structure and a multi-gate structure in which a plurality of gates are provided may be employed. A top gate structure and a bottom gate structure may be employed as well.

By applying the invention, the width of a current supply line can be increased by using efficiently the upper part or the lower part of a surface occupied by a source signal line, and a voltage drop in the current supply line can be suppressed. Consequently, particularly in a display device of a lower surface emitting type or a dual emitting type, the decrease in the aperture ratio due to the increase in the width of the current supply line can be suppressed as less as possible. As a result, a display device can be fabricated having little display unevenness due to a voltage drop and capable of displaying with high-definition. In addition, as the source signal line and the current supply line are formed on different layers, short circuit generated between the source signal line and the current supply line can be reduced and a display device with high image quality can be fabricated. The productive yield of a display device is enhanced.

[Embodiment Mode 2]

An embodiment mode of the invention will be explained with reference to FIG. 3.

Figure 3:
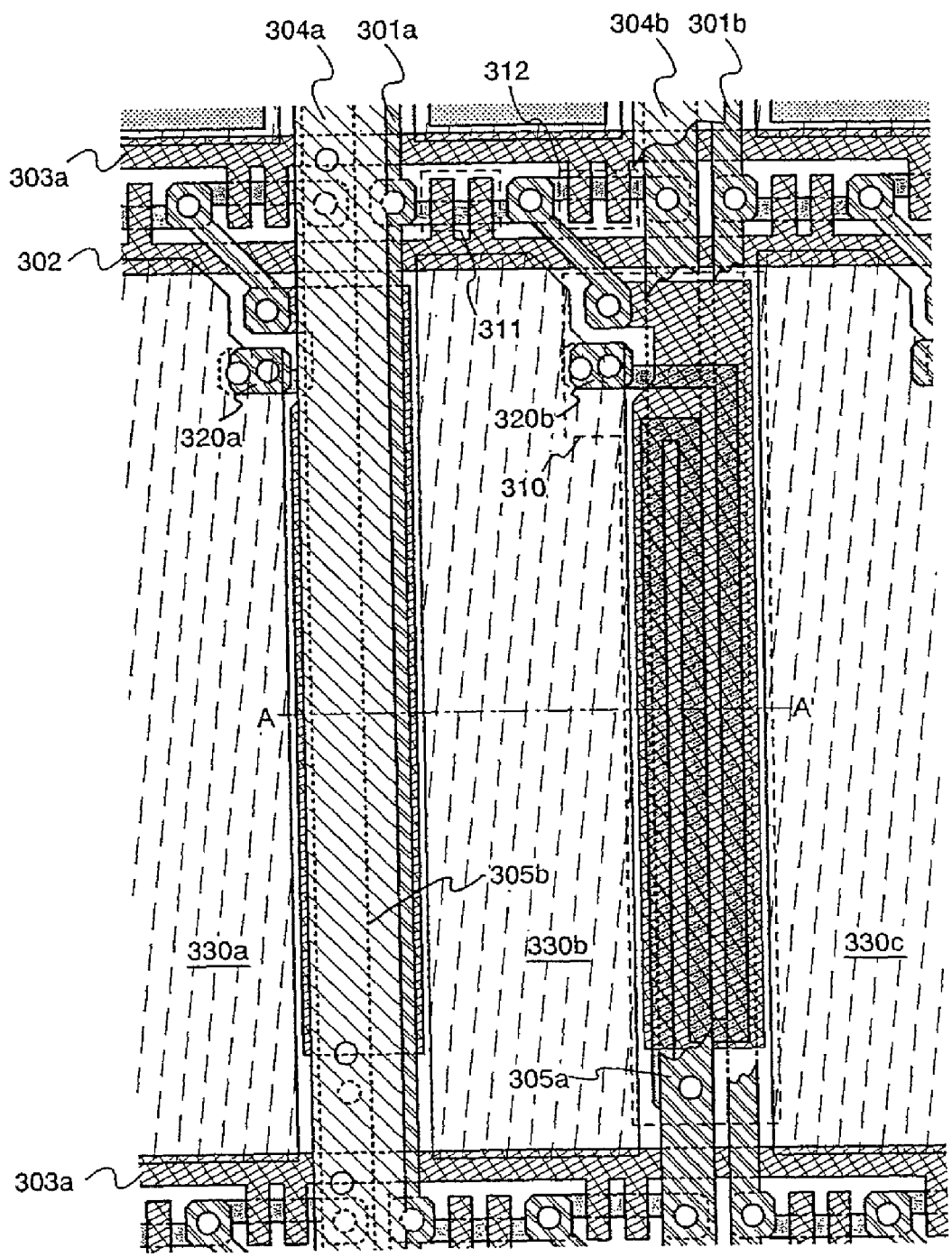
FIG. 3 is a diagram describing one mode of the invention.
Figure 10:
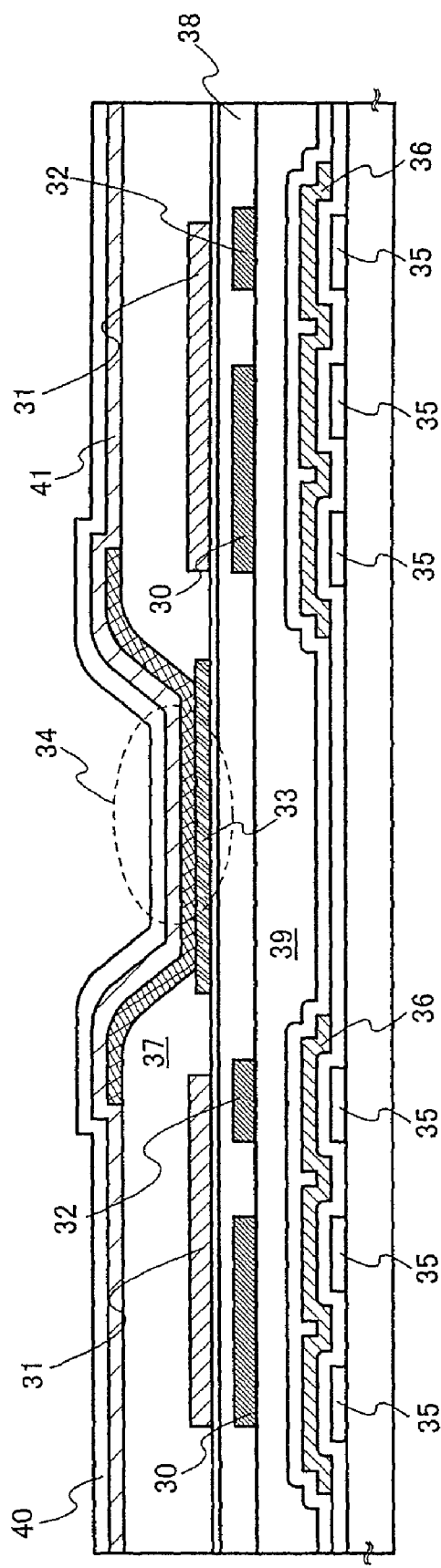
FIG. 10 is a view describing one mode of the invention.

FIG. 3 is a top plan view of a pixel portion of a display device to which the invention is applied. FIG. 10 is a cross-sectional view cutting along a line A-A' of FIG. 3.

In FIG. 3, a source signal line 301 (301a, 301b) as a wiring for transmitting a video signal and a current supply line 305 (305a, 305b) as a wiring for supplying a current to a light emitting element are provided. The source signal line 301 and the current supply line 305 are formed on the same layer and extend parallel to each other. In addition, above the source signal line 301 and the current supply line 305, a wiring 304 is formed with an insulating layer interposed therebetween. The wiring 304 extends parallel to the source signal line 301 or the current supply line 305. The wiring 304 and the current supply line 305 are connected to each other through a contact hole. Note that, in this embodiment mode, a part of the source signal line 301 and the entire current supply line 305 are overlapped with the wiring 304. However, a part of the source signal line 301 and a part of the current supply line 305 may be overlapped with the wiring 304, or the entire source signal line 301 and the entire current supply line 305 may be overlapped with the wiring 304. In any case, the voltage drop in the current supply line 305 can be suppressed by the wiring 304 which is provided by using the upper part of the current supply line 305 and connected to the current supply line 305. Further, in this embodiment mode, the wiring 304 is provided over the source signal line 301 and the current supply line 305, though the invention is not limited to this structure, and the wiring 304 may be provided under the source signal line 301 and the current supply line 305.

In addition to the source signal line 301 and the current supply line 305, a driving TFT 310 for determining whether the light emitting element emits light or not according to a video signal, a switching TFT 311 for controlling the input of the video signal, and an erasing TFT 312 for making the light emitting element in a non-light emitting state regardless of the video signal are provided in the pixel portion.

In FIG. 10, reference numeral 30 denotes a current supply line, 31 denotes a wiring, 32 denotes a source signal line, 33 denotes a first electrode of a light emitting element, 34 denotes the light emitting element, 35 denotes a semiconductor layer, 36 denotes a gate electrode, 37 denotes a bank, 38 and 39 denote insulating layers, 40 denotes a protective film, and 41 denotes a second electrode of the light emitting element.

In this embodiment mode, a part of a first gate signal line 302 functions as the gate electrode of the switching TFT 311. A part of a second gate signal line 303 functions as the gate electrode of the erasing TFT 312. In addition, the driving TFT 310 is connected to a first electrode 330 (330a, 330b, 330c) of the light emitting element through a conductive layer 321 (321a, 321b) which is formed on the same layer as the source signal line 301. Being not shown in FIG. 3, a bank having an opening portion formed so as to expose the first electrode 330 of the light emitting element, an electroluminescent layer, and a second electrode of the light emitting element are formed. An overlapping area of the first electrode 330 of the light emitting element, the electroluminescent layer and the second electrode of the light emitting element functions as the light emitting element.

FIG. 2 shows a circuit configuration of the pixel portion shown in this embodiment mode. Although the driving TFT 210, the switching TFT 211, and the erasing TFT 212 are provided in this embodiment, however, the circuit configuration comprising only the driving TFT 210 and the switching TFT 211, or the circuit configuration comprising other TFT or wiring may also be applied. That is, the circuit configuration of the invention is not limited to the one shown in this embodiment mode.

Furthermore, a thin film transistor (TFT) is used in this embodiment mode, however, a transistor fabricated by using a silicon wafer of bulk or an SOI (Silicon On Insulator) may also be used. As the structure of the transistor, both a single gate structure and a multi-gate structure in which a plurality of gates are provided may be employed. A top gate structure and a bottom gate structure may be employed as well.

By applying the invention, the width of a current supply line can be increased by using efficiently the upper part or the lower part of a surface occupied by the source signal line and a voltage drop in the current supply line can be suppressed. Consequently, particularly in a display device of a lower surface emitting type or a dual emitting type, the decrease in the aperture ratio due to the increase in the width of the current supply line can be suppressed as less as possible. As a result, a display device can be fabricated having little display unevenness due to a voltage drop and capable of displaying with high-definition.

[Embodiment Mode 3]

In each of the display devices shown in Embodiment Mode 1 and Embodiment Mode 2, the current supply line 104 or the wiring 305 are provided on the same layer as the first electrode 130 or 330 of the light emitting element respectively.

However, the structure of the display device of the invention is not limited to this, the first electrode 130 or 330 of the light emitting element may be provided over the current supply line 104 or the wiring 305 respectively with an insulating layer interposed therebetween. With such a structure, particularly in a display device of a upper surface emitting type, the opening part can be designed with more flexibility and the aperture ratio is improved.

In addition, in the fabricating process of a display device, a flattening process after the formation of a transparent conductive layer for forming the first electrodes 130 and 330 of the light emitting element may be simplified.

[EMBODIMENT 1]

In this embodiment, a configuration and a driving method of a pixel portion of a display device to which the invention applied will be explained.

Figure 4:
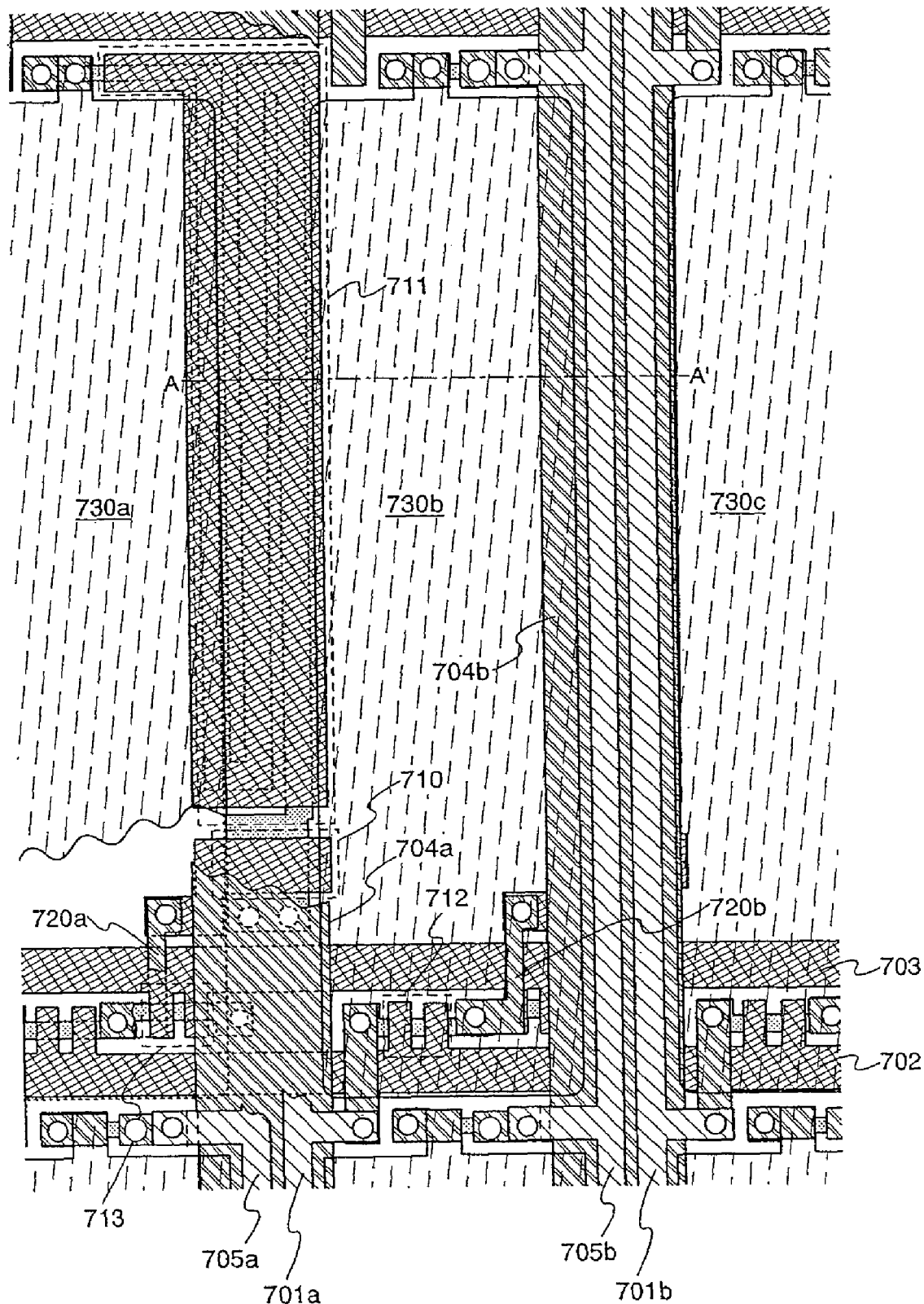
FIG. 4 is a diagram showing a circuit in a pixel portion.

In FIG. 4, a source signal line 701 (701*a*, 701*b*) as a wiring for transmitting a video signal and a current supply line 704 (704*a*, 704*b*) as a wiring for supplying a current to a light emitting element are provided. The source signal line 701 and the current supply line 704 are formed on different layers with an insulating layer interposed therebetween to overlap with each other and extend parallel to each other. A power supply line 705 is provided on the same layer as the source signal line 701 and extends parallel to the source signal line 701. The entire of the source signal line 701 and the power supply line 705 overlap with the current supply line 704. The current supply line 704 with enough long width and less voltage drop is formed by using the upper part of the source signal line 701 and the power supply line 705.

In this embodiment, the current supply line 704 is provided under the source signal line 701 and the power supply line 705, however, the invention is not limited to this structure, and the current supply line 704 may be provided over the source signal line 701. The current supply line 704 may be overlapped with only a part of the source signal line 701 or the power supply line 705.

In addition to the source signal line 701 and the current supply line 704, a current controlling TNT 711 for determining a current value flowing to the light emitting element, a driving TFT 710 for determining whether the light emitting element emits light or not according to a video signal, a switching TFT 712 for controlling the input of the video signal, and an erasing TFT 713 for making the light emitting element in a non-light emitting state regardless of the video signal are provided in the pixel portion. The current controlling TFT 711 is formed so that the L/W (channel length/channel width) is larger than the one of the driving TFT 710 and an active layer has crooked shape.

Figure 11:
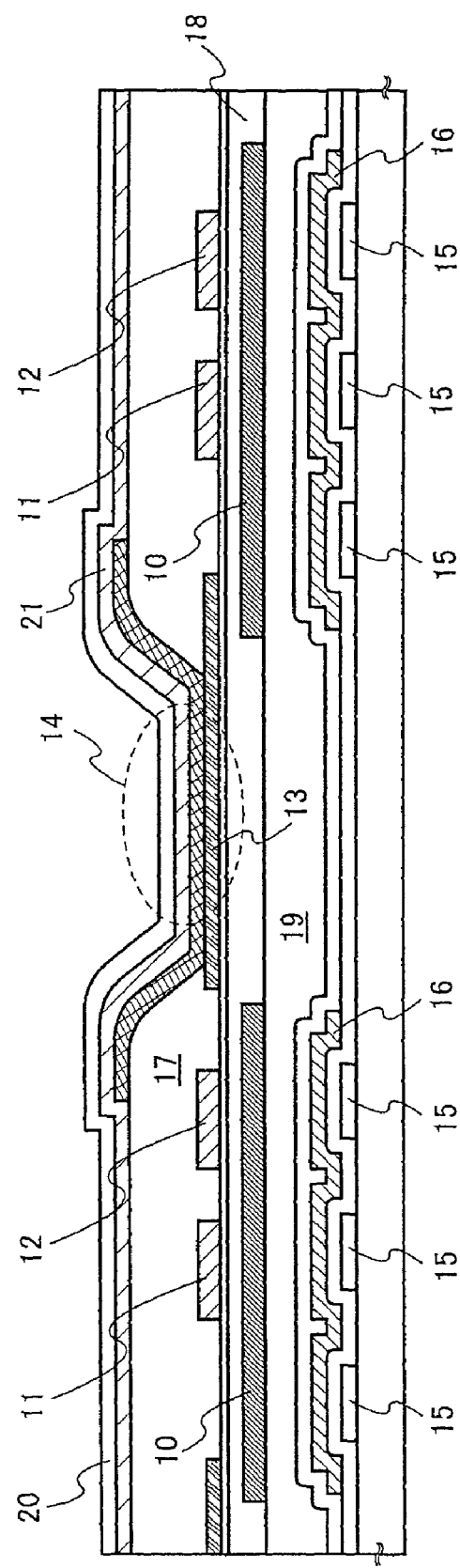
FIG. 11 is a view describing one mode of the invention.

FIG. 11 is a cross-sectional view cutting along a line A-A' of FIG. 4. In FIG. 11, insulating layers 18 and 19 are formed with an organic film. A nitride film formed by sputtering is provided on the insulating layer 18. Note that, the insulating layers 18 and 19 may be formed with an inorganic film such as a silicon oxide film as well as the organic film.

The source signal line 701 is connected to the switching TFT 712 through a conductive layer 720 (720*a*, 720*b*) which is formed on the same layer as the current supply line 704. A part of a first gate signal line 702 functions as the gate electrode of the switching TFT 712. A part of a second gate signal line 703 functions as the gate electrode of the erasing TFT 713. Further, the power supply line 705 is connected to the gate electrode of the current controlling TFT 711. The current controlling TFT 711 is connected to a first electrode 730 (730*a*, 730*b*, 730*c*) of the light emitting element through a conductive layer 720 which is formed on the same layer as the source signal line 701. The first electrode 730 of the light emitting element and the current supply line 701 are formed on the same layer. Being not shown in FIG. 4, a bank having an opening portion formed so as to expose the first electrode 730 of the light emitting element, an electroluminescent layer, and a cathode are formed. An overlapping area of the first electrode 730 of the light emitting element, the electroluminescent layer and the second electrode of the light emitting element functions as the light emitting element.

In FIG. 11, reference numeral 10 denotes a current supply line, 11 denotes a power supply line, 12 denotes a source signal line, 13 denotes a first electrode of a light emitting element, 14 denotes the light emitting element, 15 denotes a semiconductor layer, 16 denotes a gate electrode, 17 denotes a bank, 18 and 19 denote insulating layers, 20 denotes a protective film, and 21 denotes a second electrode of the light emitting element.

Figure 5:
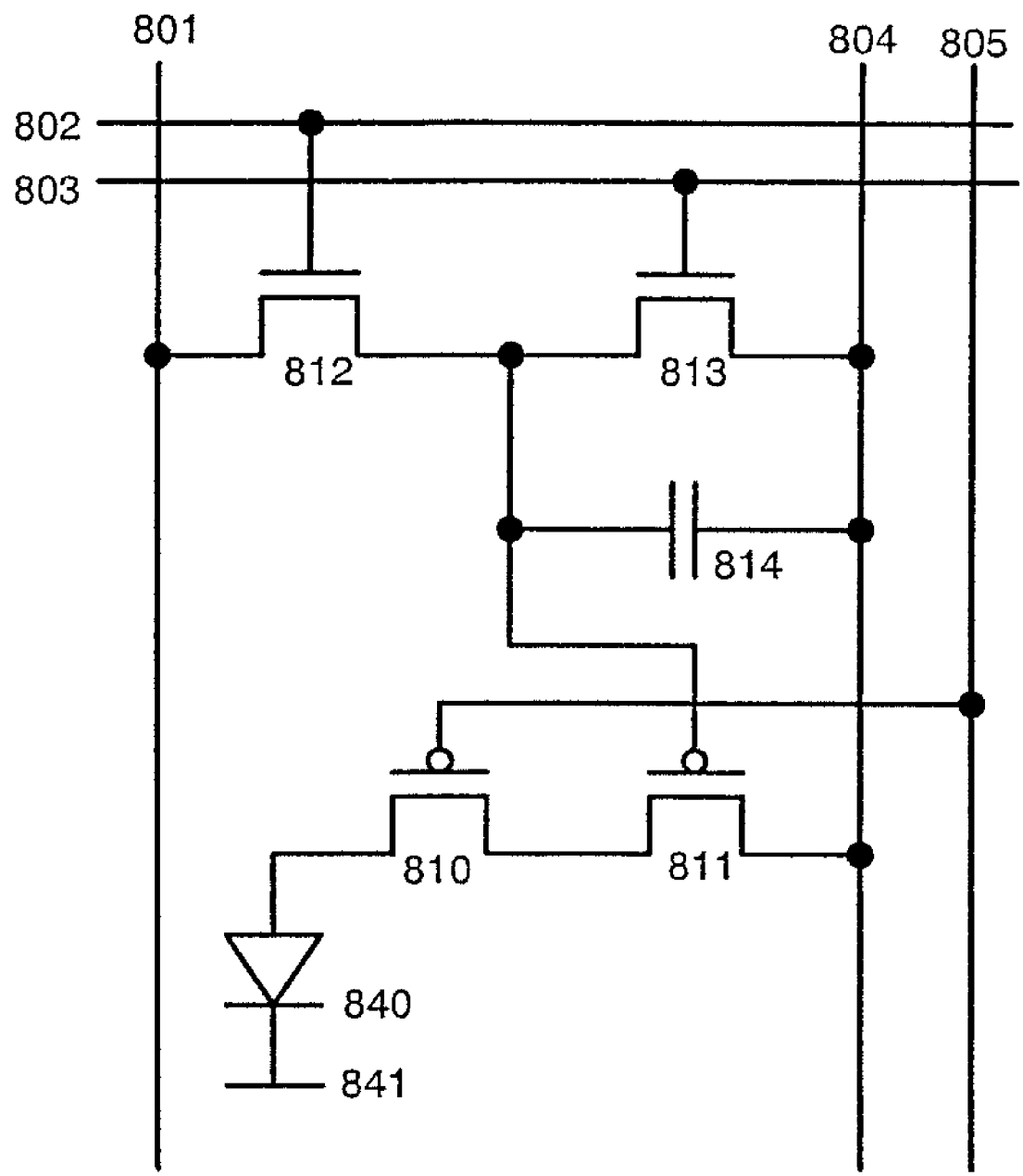
FIG. 5 is a diagram describing one mode of the invention.

FIG. 5 shows a circuit configuration of the pixel portion shown in this embodiment.

In FIG. 5, a p-channel transistor is used for a driving TFT 811 and a current controlling TFT 810, and the drain of the current controlling TFT 810 and an anode of a light emitting element 840 are connected to each other. In this embodiment, the first electrode 730 of the light emitting element functions as an anode and the second electrode of the light emitting element functions as a cathode. On the other hand, in the case where an n-channel TFT is used for the driving TFT 811 and the current controlling TFT 810, the source of the current controlling TFT 810 and a cathode of the light emitting element 840 are connected to each other. In this case, the first electrode 730 of the light emitting element functions as a cathode and the second electrode of the light emitting element functions as an anode.

A driving method of the pixel shown in FIG. 5 will be explained next. The operation of the pixel shown in FIG. 5 can be explained by dividing into a writing period and a holding period. Firstly, a first gate signal line 802 is selected in the writing period, thereby turning on a switching TFT 812 whose gate is connected to the first gate signal line 802. Then a video signal inputted to a source signal line 801 is inputted to the gate of the driving TFT 811 through the switching TFT 812. Note that, the current controlling TFT 810 is always turned on as the gate is connected to a power supply line 805.

In the case where the driving TFT 811 is turned on by a video signal, a current is supplied to the light emitting element 840 through the current supply line 804. In this embodiment, the driving TFT 811 operates in a linear region, and a current flowing to the light emitting element 840 is determined according to voltage-current characteristics of the current controlling TFT 810 which operates in a saturation region and the light emitting element 840. The light emitting element 840 emits light with the brightness corresponding to the supplied current.

In the case where the current controlling TFT 810 is turned off by a video signal, no current is supplied to the light emitting element 840 and the light emitting element 840 does not emit light.

Secondly, in a holding period, the switching TFT 812 is turned off by controlling a potential of the first gate signal line 802 and a potential of the video signal which has been written in the writing period is held. In the case where the driving TFT 811 is turned on in the writing period, a current supplied to the light emitting element 840 is kept as the potential of the video signal is held in a capacitor 814. On the other hand, in the case where the driving TFT 811 is turned off in the writing period, a current is not supplied to the light emitting element 840. Note that, although the capacitor 814 is provided in a circuit in this embodiment, a circuit without capacitor is also possible.

In an erasing period, a second gate signal line 803 is selected and an erasing TFT 813 is turned on to apply a potential of the current supply line 804 to the gate of the driving TFT 811 through the erasing TFT 813. Consequently, the driving TFT 811 is turned off, so that a compulsive state in which a current is not supplied to the light emitting element 840 can be produced.

In the above-mentioned configuration, the current controlling TFT 810 operates in a saturation region. Therefore, the variation of a drain current of the current controlling TFT 810 is small against the variation of a voltage between the source and the drain of the current controlling TFT 810, and a current flowing to the light emitting element 840 is less sensitive to a slight change in a voltage between the gate and the source of the driving TFT 811 (Vgs). The current flowing to the light emitting element 840 is determined by the current controlling 1 810 which operates in a saturation region. Therefore, it realizes no influence on the current flowing to the light emitting element 840 without increasing the capacitance of a capacitor 814 provided between the gate and the source of the current controlling TFT 810 and suppressing an OFF current of the switching TFT 812 to low. The current flowing to the light emitting element 840 is also not sensitive to the parasitic capacitance in the gate of the driving TFT 811. As a result, the brightness variation due to the variation in characteristics of TFTs and the like is reduced and display unevenness can be reduced.

As for the light emitting element 840, the first electrode 730 and the second electrode are formed with a transparent conductive layer in this embodiment. Therefore, a light can be received from both sides, the upper surface and the lower surface (the side on which the TFT is formed is referred to as the lower surface, and the opposite side thereof is referred to as the upper surface with the electroluminescent layer interposed therebetween). Note that, the display device of the invention is not limited to this structure, the structure of receiving a light from either the upper surface or the lower surface may be applied.

By applying the invention, the width of the current supply line can be increased by using the lower part of a surface occupied by the source signal line and the power supply line and a voltage drop in the current supply line can be suppressed. Consequently, in a display device of receiving a light from a lower surface such as the one shown in this embodiment, the decrease in the aperture ratio due to the increase in the width of the current supply line can be suppressed as less as possible. As a result, a display device can be fabricated having little display unevenness due to a voltage drop and capable of displaying with high-definition. In addition, by applying a circuit configuration shown in this embodiment, display unevenness due to the variation in characteristics of TFTs can be suppressed and a display image with high quality is achieved.

EMBODIMENT 2

In this embodiment, a structure and a driving method of an active matrix display device comprising the pixel portion shown in Embodiment 1 will be explained.

Figure 6:
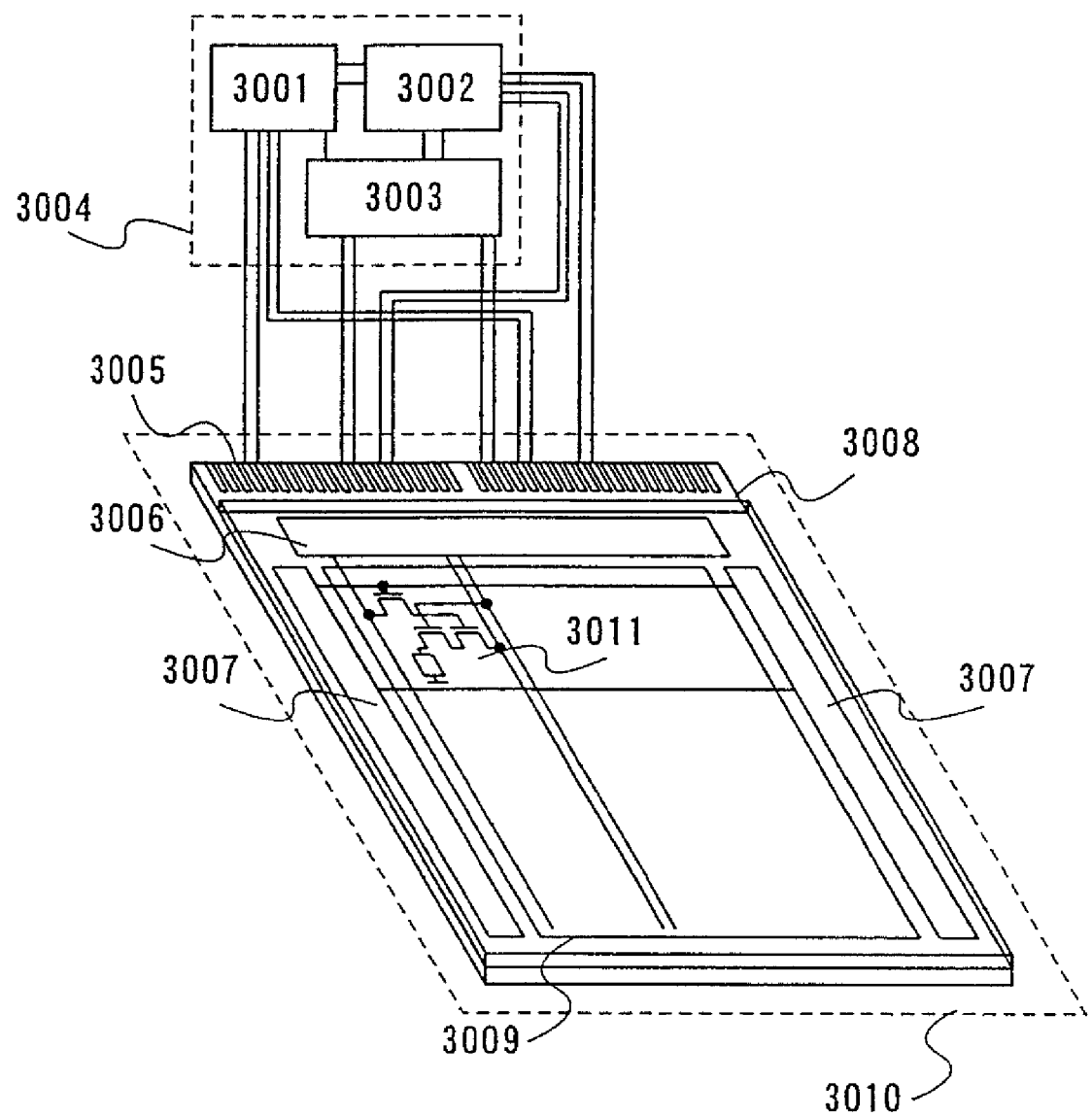
FIG. 6 is a schematic diagram showing an external circuit and a panel.

A block diagram of an external circuit and a schematic diagram of a panel are shown in FIG. 6.

As shown in FIG. 6, the active matrix display device to which the present invention is applied comprises an external circuit 3004 and a panel 3010. The external circuit 3004 comprises an A/D converter 3001, a power supply portion 3002, and a signal generating portion 3003. In the A/D converter 3001, an analog video data signal is converted into a digital video data signal to supply it to a signal driver circuit 3006. In the power supply portion 3002, power sources each of which has a desired voltage value are generated by power sources supplied from a battery or a socket and supplied to the signal driver circuit 3006, a scan driver circuit 3007, an OLED element 3011, the signal generating portion 3003 and the like. The power source, the video signal, a synchronous signal and the like are inputted to the signal generating portion 3003 and each signal is converted, and a clock signal and the like for driving the signal driver circuit 3006 and the scan driver circuit 3007 are generated therein.

The signals and the power sources from the external circuit 3004 are inputted to an internal circuit and the like from an FPC connection portion 3005 within a panel through an FPC.

The panel 3010 comprises the FPC connection portion 3005 and the internal circuit, which are disposed on a grass substrate 3008, and the OLED element 3011. The internal circuit comprises the signal driver circuit 3006, the scan driver circuit 3007, and a pixel portion 3009. Although the pixel described in Embodiment Mode 1 is applied to the one in FIG. 6 as an example, any one of pixel configurations described in embodiment modes of the invention may be applied to the pixel portion 3009.

The pixel portion 3009 is disposed in the center of the substrate, and the signal driver circuit 3006 and the scan driver circuit 3007 are disposed around the pixel portion 3009. A plurality of the OLED elements 3011 and a counter electrode of the light emitting elements are formed over the whole surface of the pixel portion 3009.

Figure 7:
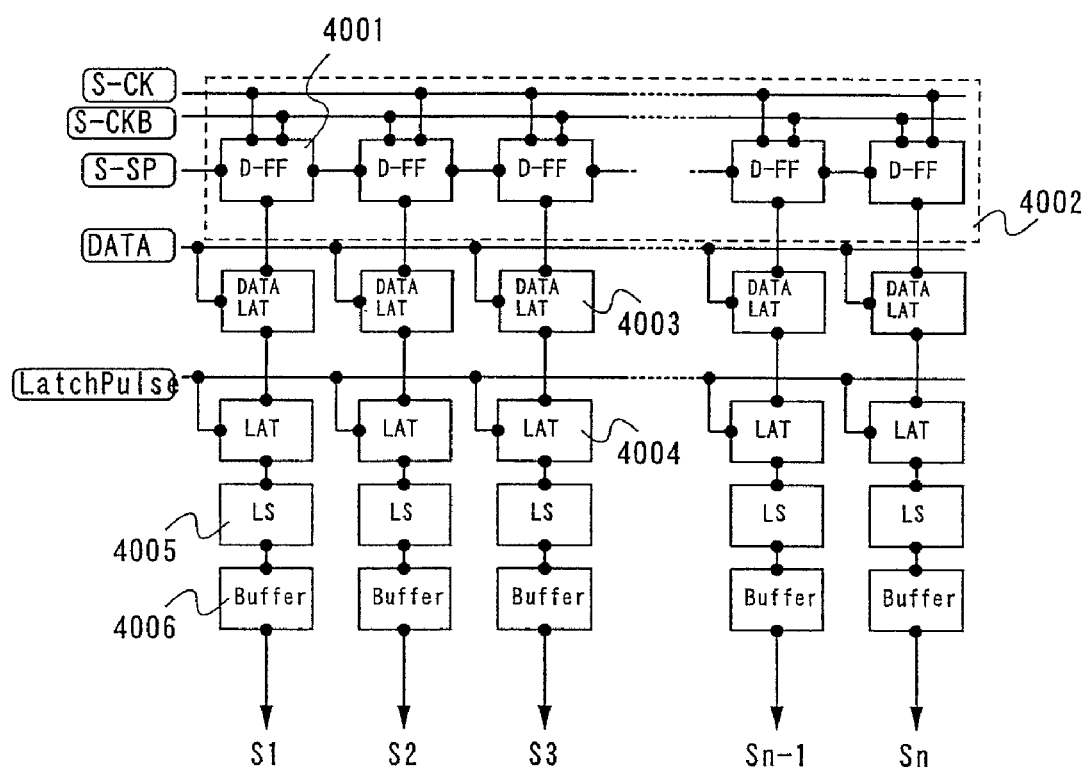
FIG. 7 is a configuration diagram of a signal line driver circuit.

A block diagram of the signal driver circuit 3006 is shown in FIG. 7 in more details.

The signal driver circuit 3006 comprises a shift register 4002 which is composed of plural stages of D flip-flops 4001, data latch circuits 4003, latch circuits 4004, level shifters 4005, and buffers 4006 and the like.

Signals to be inputted to the signal driver circuit 3006 are a clock signal (S-CK), an inverted clock signal (S-CKB), a start pulse (S-SP), a digital video signal (DATA), and a latch pulse (LatchPulse).

First, the shift register 4002 outputs a sampling pulse sequentially in timing with the clock signal, the inverted clock signal, and the start pulse. The sampling pulse is inputted to the data latch circuit 4003, where the digital video signal is taken in and held in response to the input of the sampling pulse. This operation is conducted in order starting from the first column.

After the digital video signal is held in the data latch circuit 4003 at the last column, the latch pulse is inputted during the horizontal retrace period to transmit the digital video signals held in the data latch circuits 4003 to the latch circuits 4004 simultaneously. Then, the digital video signal is level-shifted by the level shifter 4005 and rectified by the buffer 4006 before being outputted simultaneously to signal lines S1 to Sn. Accompanied by this output, H level/L level is inputted to a pixel in a row selected by the scan driver circuit 3007 to control whether the OT FD element 3011 emits light or not.

The active matrix display device shown in this embodiment comprises the panel 3010 and the external circuit 3004 which are provided separately. The panel and the external circuit may be integrally formed on the same substrate. In addition, the OLED element is used in the display device, however, another light emitting element may be used as well as the OLED element in a light emitting device. The level shifter 4005 and the buffer 4006 are not necessarily provided in the signal driver circuit 3006.

EMBODIMENT 3

Electronic apparatuses to which the present invention is applied will be explained in this embodiment. A display device using the invention realizes display with high quality images and high-definition by being mounted on various electronic apparatuses. In addition, it can be mounted on small electronic apparatuses such as a mobile phone as well as on a large display device such as a television.

Figure 8A:
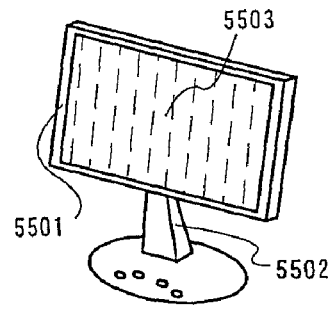
FIGS. 8A to 8F are views of electronic apparatuses to which the invention is applied.

FIG. 8A is a display device which includes a housing 5501, a support base 5502, and a display portion 5503. The invention is applicable to a display device having the display portion 5503.

Figure 8B:
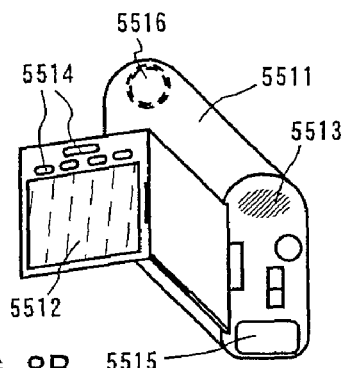

FIG. 8B is a video camera which includes a body 5511, a display portion 5512, a sound input portion 5513, operation switches 5514, a battery 5515, and an image receiving portion 5516.

Figure 8C:
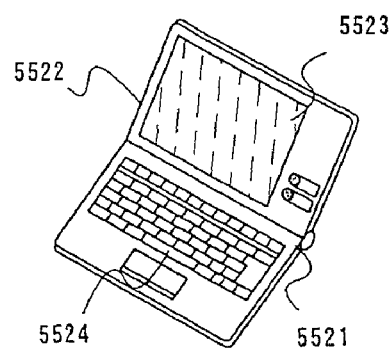

FIG. 8C is a notebook personal computer to which the invention is applied and which includes a body 5501, a housing 5502, a display portion 5503, and a keyboard 5504.

Figure 8D:
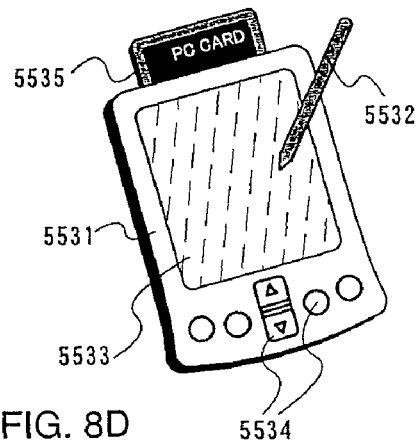

FIG. 8D is a personal data assistant (PDA) to which the invention is applied. A body 5531 includes a display portion 5532, an external interface 5535, operation buttons 5534 and the like. In addition, a stylus 5532 is provided as an attachment for the operation.

Figure 8E:
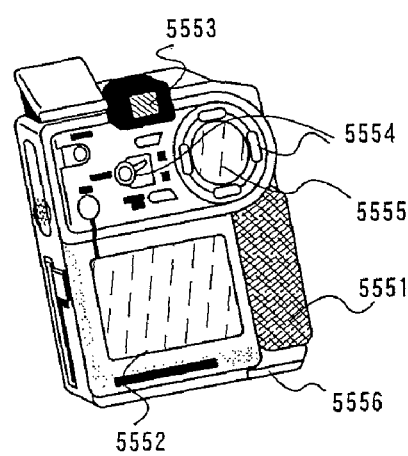

FIG. 8E is a digital camera which includes a body 5551, a display portion (A) 5552, an eye contacting portion 5553, an operation switch 5554, a display portion (B) 5555, and a battery 5556.

Figure 8F:
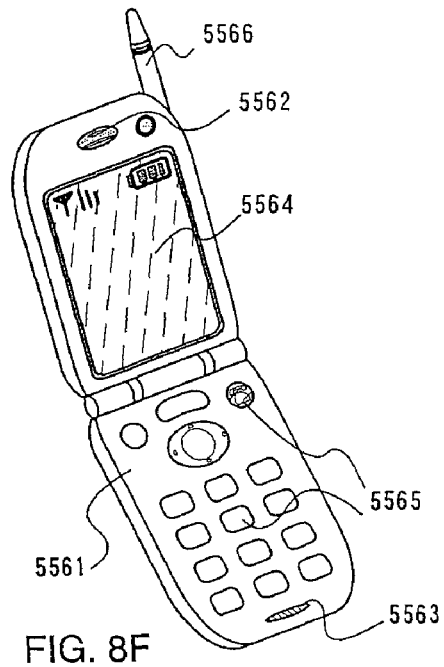

FIG. 8F is a mobile phone to which the invention is applied. A body 5561 includes a display portion 5564, a sound output portion 5562, operation switches 5565, and an antenna 5566.

What is claimed is:

1. A display device comprising:
   a first insulating layer over a source or drain electrode of a transistor;
   a first line;
   a second line;
   a third line;
   a pixel electrode over the first insulating layer;
   a second insulating layer covering an end portion of the third line and an end portion of the pixel electrode;
   an EL layer over the second insulating layer;
   a cathode over the second insulating layer;
   an opening of the second insulating layer over the pixel electrode,
   wherein a part of the EL layer is provided in the opening,
   wherein a part of the cathode is provided in the opening,
   wherein a part of the third line overlaps a part of the first line,
   wherein a part of the third line is in parallel with a part of the first line,
   wherein a part of the third line is in parallel with a part of the second line,
   wherein the pixel electrode is in contact with the first insulating layer, and
   wherein the third line is in contact with the first insulating layer.

2. The display device according to claim 1, wherein the pixel electrode is provided by using a material which differs from a material used for providing the third line.

3. The display device according to claim 1, wherein the first line is formed on the same layer as the second line.

4. The display device according to claim 1, wherein the first line is a current supply line for an EL element.

5. The display device according to claim 1, wherein the second line is a video signal line.

6. A display device comprising:
   a first insulating layer over a source or drain electrode of a transistor;
   a first line configured to supply current to an EL element;
   a second line configured to supply a video signal;
   a third line;
   a pixel electrode over the first insulating layer;
   a second insulating layer covering an end portion of the third line and an end portion of the pixel electrode;
   an EL layer over the second insulating layer;
   a cathode over the second insulating layer;
   an opening of the second insulating layer over the pixel electrode,
   wherein a part of the EL layer is provided in the opening,
   wherein a part of the cathode is provided in the opening,
   wherein a part of the third line overlaps a part of the first line,
   wherein a part of the third line is in parallel with a part of the first line,
   wherein a part of the third line is in parallel with a part of the second line,
   wherein the pixel electrode is in contact with the first insulating layer, and
   wherein the third line is in contact with the first insulating layer.

7. The display device according to claim 6, wherein the pixel electrode is provided by using a material which differs from a material used for providing the third line.

8. The display device according to claim 6, wherein the first line is formed on the same layer as the second line.

9. A display device comprising:
   a first insulating layer over a source or drain electrode of a transistor;
   a first line;
   a second line;
   a third line;
   a pixel electrode over the first insulating layer;
   a second insulating layer covering an end portion of the third line and an end portion of the pixel electrode;
   an EL layer over the second insulating layer;
   a cathode over the second insulating layer;
   an opening of the second insulating layer over the pixel electrode,
   wherein a part of the EL layer is provided in the opening,
   wherein a part of the cathode is provided in the opening,
   wherein a part of the third line overlaps a part of the first line,
   wherein a part of the third line is in parallel with a part of the first line,
   wherein a part of the third line is in parallel with a part of the second line,
   wherein the pixel electrode is in contact with the first insulating layer, and
   wherein the third line is in contact with the first insulating layer, and
   wherein a voltage is supplied into the third line.

10. A display device comprising:
    a first insulating layer over a source or drain electrode of a transistor;
    a first line;
    a second line;
    a third line;
    a pixel electrode over the first insulating layer;
    a second insulating layer covering an end portion of the third line and an end portion of the pixel electrode;
    an EL layer over the second insulating layer;
    a cathode over the second insulating layer;
    an opening of the second insulating layer over the pixel electrode,
    wherein a part of the EL layer is provided in the opening,
    wherein a part of the cathode is provided in the opening,
    wherein a part of the third line overlaps a part of the first line, wherein a part of the third line is in parallel with a part of the first line,
wherein a part of the third line is in parallel with a part of the second line,
wherein the pixel electrode is in contact with the first insulating layer, and
wherein the third line is in contact with the first insulating layer, and
wherein the third line is a power supply line.

11. A display device comprising:
a first insulating layer over a source or drain electrode of a transistor;
a first line configured to supply current to an EL element;
a second line configured to supply a video signal;
a third line;
a pixel electrode over the first insulating layer;
a second insulating layer covering an end portion of the third line and an end portion of the pixel electrode;
an EL layer over the second insulating layer;
a cathode over the second insulating layer;
an opening of the second insulating layer over the pixel electrode,
wherein a part of the EL layer is provided in the opening,
wherein a part of the cathode is provided in the opening,
wherein a part of the third line overlaps a part of the first line,
wherein a part of the third line is in parallel with a part of the first line,
wherein a part of the third line is in parallel with a part of the second line,
wherein the pixel electrode is in contact with the first insulating layer,
wherein the third line is in contact with the first insulating layer, and
wherein a voltage is supplied into the third line.

12. A display device comprising:
a first insulating layer over a source or drain electrode of a transistor;
a first line configured to supply current to an EL element;
a second line configured to supply a video signal;
a third line;
a pixel electrode over the first insulating layer;
a second insulating layer covering an end portion of the third line and an end portion of the pixel electrode;
an EL layer over the second insulating layer;
a cathode over the second insulating layer;
an opening of the second insulating layer over the pixel electrode,
wherein a part of the EL layer is provided in the opening,
wherein a part of the cathode is provided in the opening,
wherein a part of the third line overlaps a part of the first line,
wherein a part of the third line is in parallel with a part of the first line,
wherein a part of the third line is in parallel with a part of the second line,
wherein the pixel electrode is in contact with the first insulating layer,
wherein the third line is in contact with the first insulating layer, and
wherein the third line is a power supply line.

* * * * *

UNITED STATES PATENT AND TRADEMARK OFFICE
CERTIFICATE OF CORRECTION

PATENT NO. : 8,139,001 B2
APPLICATION NO. : 13/211815
DATED : March 20, 2012
INVENTOR(S) : Masayuki Sakakura It is certified that error appears in the above-identified patent and that said Letters Patent is hereby corrected as shown below:

Column 2, line 24, replace "fanned" with --formed--;

Column 7, line 31, replace "TNT" with --TFT--;

Column 9, line 10, replace "1" with --TFT--;

Column 10, line 50, replace "OT FD" with --OLED--.

Signed and Sealed this
Twenty-fourth Day of July, 2012

David J. Kappos
*Director of the United States Patent and Trademark Office*